April 25, 1967 D. A. JENNY 3,316,458

ELECTRONIC CIRCUIT ASSEMBLY WITH RECESSED SUBSTRATE MOUNTING MEANS

Filed Jan. 29, 1965 2 Sheets-Sheet 1

INVENTOR.
DIETRICH A. JENNY,
BY John M. Koch
ATTORNEY.

April 25, 1967 D. A. JENNY 3,316,458

ELECTRONIC CIRCUIT ASSEMBLY WITH RECESSED SUBSTRATE MOUNTING MEANS

Filed Jan. 29, 1965 2 Sheets-Sheet 2

INVENTOR.
DIETRICH A. JENNY,
BY John M. Koch
ATTORNEY.

United States Patent Office 3,316,458

Patented Apr. 25, 1967

3,316,458

ELECTRONIC CIRCUIT ASSEMBLY WITH RECESSED SUBSTRATE MOUNTING MEANS

Dietrich A. Jenny, Santa Ana, Calif., assignor to Hughes Aircraft Company, Culver City, Calif., a corporation of Delaware Filed Jan. 29, 1965, Ser. No. 428,913
3 Claims. (Cl. 317—101)

This invention relates to mounting circuit components in circuit boards and in particular to recessing circuit components in a circuit board for protection of the components from mechanical injury and for better configurational arrangement.

Accordingly, it is a primary object of this invention to mount discrete circuit components such as transistors, diodes, and the like, in a circuit board so that the components are not vulnerably positioned to mechanical damage on top of the circuit board, but instead are recessed in the boards so that the upper surfaces of the components are at least flush with the surface plane of the circuit board and thus are protected from injury.

Another object of this invention is to mount discrete circuit components in a circuit board to provide an improved geometrical or spacial arrangement for maximum close packing density and optimum convenience in handling.

A more detailed description of the invention as compared to prior art practices is given below for purposes of illustration and not limitation with reference to the appended drawings, wherein.

Figure 1:
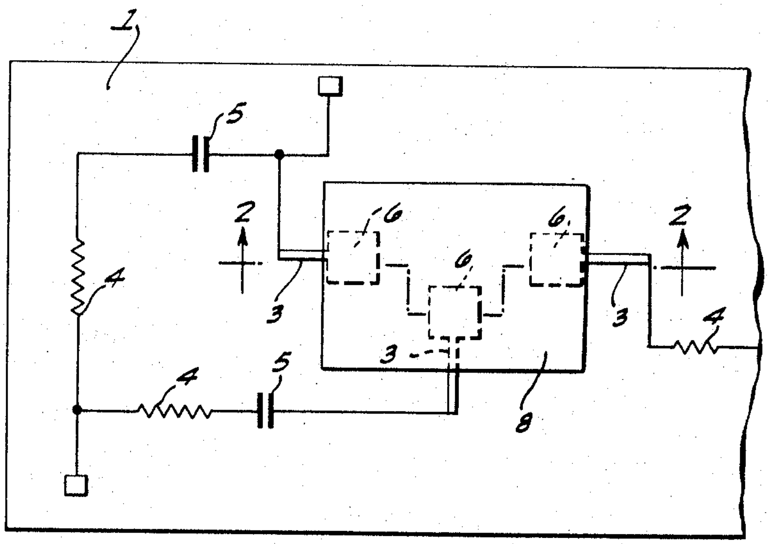
(PRIOR ART) FIG. 1.
FIG. 1 is a partial plan view showing a prior art type circuit board arrangement.

According to the prior art, circuit components are mounted on top of the circuit board, as shown in FIG. 1. In FIG. 1 the various components, such as resistors 4 and capacitors 5 are shown schematically for convenience, it being understood that these are provided according to well known printed circuit techniques. These components are generally connected by means of electrically conductive paths, such as 3, formed by evaporated metal, or the like, on an insulating substrate board 1. In order to mount a transistor or diode device 8, extremely small solder balls 7 are employed in conjunction with relatively large area contact pads 6. Often widely different materials must be used for the evaporated metallic contact pad 6 and the metal contact areas on the semiconductor device, it being exceedingly difficult, if not practically impossible, to evaporate a good solderable material onto the contact areas 6 because of the fact that the contact areas and the leads or connecting pads 3 all lie on the same plane.

It will also be appreciated that devices mounted on printed circuit boards according to the prior art are subject to being dislocated or knocked off very easily. In addition, such prior art circuit board arrangements are bulky and not conveniently handled or packed.

If a recess is formed in the printed circuit board in which a discrete device may be mounted flush with the surface, the problems of providing connections to the devices still remain. Thus metal must be plated across the gap or crack between the surface of the board and the surface of the device or, if connections are made to the bottom of the device, metal must be applied up to the edge of the recess then down the side walls of the recess and across the bottom. This latter embodiment requires two right angle turns which are practically impossible to achieve by any feasible plating process.

Figure 2:
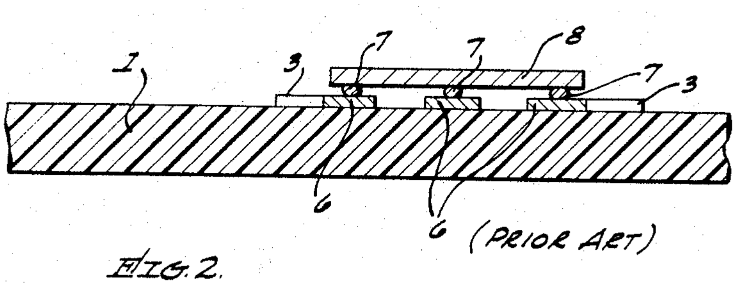
(PRIOR ART) FIG. 2.
FIG. 2 is a partial sectional view taken along line 2—2 of FIG. 1 showing a circuit component mounted on top of a circuit board.
Figure 3:
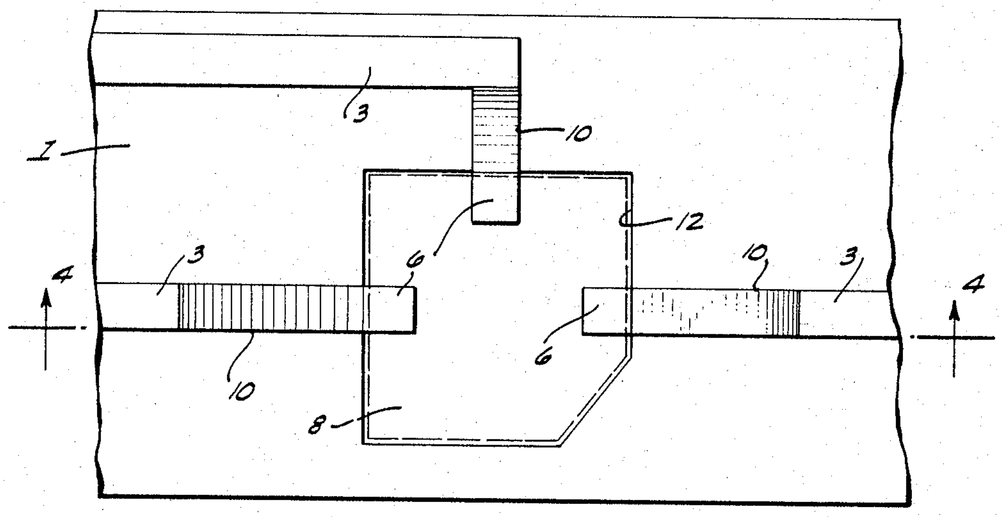
FIG. 3 is a partial plan view showing the method of mounting circuit components in accordance with the invention.
Figure 4:
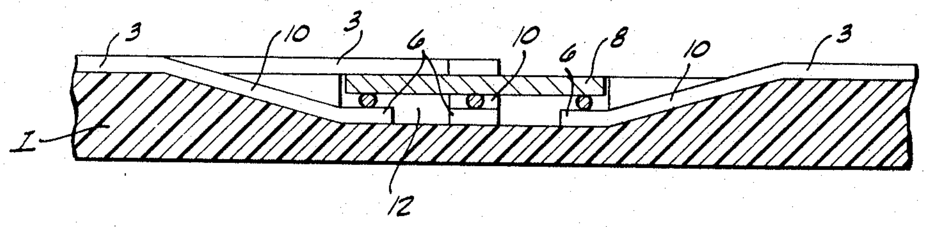
FIG. 4 is a partial sectional view taken along line 4—4 of FIG. 3.

Referring now to FIG. 2, I have shown a way of avoiding these difficulties while providing a discrete device in a recess in a printed circuit board. The recess is generally designated by the reference numeral 12. It is an additional feature of this invention that the recess be formed in any non-regular or unsymmetrical shape, such as shown in FIG. 2, so as to permit the indexing of the device into the recess in only one position.

The evaporated metal conductive strips 3 are brought down to the bottom of the recess 12 by means of ramps 10 which are cut into the edges of the recess so as to provide a grade from the surface of the board to the bottom of the recess without any abrupt corners, or the like.

The contact pad portions 6 may likewise be provided in the bottom of the recess as a continuous extension of the lead paths 3. Because the contact pads 6 are located on a different plane from that of the lead paths 3, it is feasible to form the contact pads 6, as well as the ramp portions 10, of solderable material.

While the use of solder balls is possible with the present invention, it is preferred to employ "bumps" of metal which are fused to the respective parts of the component. These bumps may be coated with a solder metal after they have been fused to the device. Any conventional solder may be used depending upon the characteristics desired such as melting point.

While any discrete electronic component or device may be mounted by the present invention, the practice of the invention is particularly useful for mounting semi-conductor devices such as silicon diffused glass ambient dice on a passive integrated substrate. The recess may be provided in any indexing shape, the only criterion being the avoidance of rotational ambiguity as is possible with complete circular, square, or rectangular shapes.

It will be seen that by the use of the method and device of the invention an improved arrangement of discrete electronic components on a circuit board is achieved wherein maximum close packing density and optimum convenience in handling of the circuit board are accomplished. The resulting circuit or network is completely contained in a square or rectangular sheet or board of minimum thickness and without protrusions due to circuit components. It is contemplated that this invention is applicable not only to circuit boards but to the use of any type of circuit or network substrate including printed, thin-film deposited, or otherwise constructed substrate. Furthermore, the circuit component need not be restricted to merely one function, but may well constitute an integrated chip or die. In addition, the invention is applied to "glass ambient" or planar silicon chips or dice with metal contact bumps.

Obviously many other modifications and variations of the present invention are possible in the light of the above teachings. It is therefore to be understood that within the scope of the appended claims the invention can be practiced otherwise than as specifically described.

What is claimed is:

1. In an electronic circuit assembly a generally planar substrate,
said substrate having on one side thereof a first surface and a second surface,
the second surface being in depressed relation to said first surface as seen in side-elevational view to define a recess in the substrate,
ramp surfaces of inclined plane configuration as seen in side-elevational view interconnecting the first surface and the second surface,
electrically conductive path means on said respective surfaces to provide terminal electrical lead means on said second surface, arcuate protuberances on said terminal lead means and above said second surface, and a discrete electronic component being entirely within the recess defined by the elevational displacement of said first and second surfaces, said arcuate protuberances supporting the component from the lead means.

2. An electronic circuit assembly according to claim 1, wherein the recess formed at said generally planar substrate is of irregular configuration to accommodate proper physical alignment of said electronic component.

3. An electronic circuit assembly according to claim 2, wherein said electrical leads are at least three in number and are evaporatively positioned on the respective surfaces.

References Cited by the Examiner

UNITED STATES PATENTS

| | | | |
|---|---|---|---|
| 2,938,939 | 5/1960 | Malcolm | 317—101 X |
| 2,989,669 | 6/1961 | Lathrop | 317—101 X |
| 3,192,307 | 6/1965 | Lazar | 317—101 X |

ROBERT K. SCHAEFER, *Primary Examiner.*

W. C. GARVERT, *Assistant Examiner.*